(12) United States Patent
Li et al.

(10) Patent No.: US 6,790,785 B1
(45) Date of Patent: Sep. 14, 2004

(54) METAL-ASSISTED CHEMICAL ETCH POROUS SILICON FORMATION METHOD

(75) Inventors: Xiuling Li, Champaign, IL (US); Paul W. Bohn, Champaign, IL (US); Jonathan V. Sweedler, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/662,682

(22) Filed: Sep. 15, 2000

(51) Int. Cl.⁷ ............................................. H01L 21/302
(52) U.S. Cl. ..................... 438/745; 438/750; 438/753; 205/606; 205/674; 216/56
(58) Field of Search ................................ 438/745, 750, 438/753, 754, 571, 575, 580; 205/606, 674, 665; 216/56

(56) References Cited

U.S. PATENT DOCUMENTS

| | | |
|---|---|---|
| 3,653,989 A | 4/1972 | Widmer |
| 4,078,945 A | 3/1978 | Gonsiorawski |
| 4,092,445 A | 5/1978 | Tsuzuki et al. |
| 4,681,657 A * | 7/1987 | Hwang et al. ............... 156/345 |
| 5,089,293 A * | 2/1992 | Bohara et al. ............... 427/102 |
| 5,139,624 A | 8/1992 | Searson et al. |
| 5,206,523 A | 4/1993 | Goesele et al. |
| 5,552,328 A | 9/1996 | Orlowski et al. |
| 5,565,084 A * | 10/1996 | Lee et al. .................... 205/646 |
| 5,695,557 A * | 12/1997 | Yamagata et al. ............ 117/97 |
| 5,767,020 A | 6/1998 | Sakaguchi et al. |
| 5,868,947 A | 2/1999 | Sakaguchi et al. |
| 5,873,003 A | 2/1999 | Inoue et al. |
| 5,895,223 A | 4/1999 | Peng et al. |
| 5,970,361 A | 10/1999 | Kumomi et al. |
| 5,981,400 A | 11/1999 | Lo |
| 5,990,605 A * | 11/1999 | Yoshikawa et al. .......... 313/310 |
| 6,017,811 A * | 1/2000 | Winton et al. ............... 438/597 |
| 6,093,941 A * | 7/2000 | Russell et al. ............... 257/103 |

OTHER PUBLICATIONS

D. Dimova–Malinovska, M. Sendova–Vassileva, N. Tzenov and M. Kamenova, "Preparation of Thin Porous Silicon Layers by Stain Etching", Thin Solid Films 297, 1997, pp. 9–12.

T. Monguchi, H. Fujioka, K. Ono, Y. Baba, M. Oshima, "Effects of Wet Etching on Photoluminescence of Porous Silicon", Journal of the Electrochemical Society, vol. 147, No. 2, 2000, pp. 602–605.

J. Salonen, V. Lehto, M. Bjorkqvist, E.Laine, "A Role of Illumination During Etching to Porous Silicon Oxidation", Applied Physics Letters, vol. 75, No. 6, Aug. 9, 1999, pp. 826–828.

T. Tsuboi, T. Sakka, Y.H. Ogata, "Chemical Etching of Porous Silicon in Diluted Hydrofluoric Acid", Solid State Communications, vol. 109, 1999, pp. 195–199.

* cited by examiner

*Primary Examiner*—Lan Vinh
(74) *Attorney, Agent, or Firm*—Greer, Burns & Crain, Ltd.

(57) ABSTRACT

A thin discontinuous layer of metal such as Au, Pt, or Au/Pd is deposited on a silicon surface. The surface is then etched in a solution including HF and an oxidant for a brief period, as little as a couple seconds to one hour. A preferred oxidant is $H_2O_2$. Morphology and light emitting properties of porous silicon can be selectively controlled as a function of the type of metal deposited, Si doping type, silicon doping level, and/or etch time. Electrical assistance is unnecessary during the chemical etching of the invention, which may be conducted in the presence or absence of illumination.

21 Claims, 8 Drawing Sheets

METAL-ASSISTED CHEMICAL ETCH POROUS SILICON FORMATION METHOD

STATEMENT OF GOVERNMENT INTEREST

This invention was made with government assistance from the Department of Energy under grant DEFG02-91-ER-45439. The governmental has certain rights in this invention.

FIELD OF THE INVENTION

The field of the invention is porous silicon formation.

BACKGROUND OF THE INVENTION

Silicon, in its naturally occurring elemental form, is not light emitting. Silicon may be changed to porous silicon, a modified form of silicon. The unique electronic, morphological, and thermal properties of porous silicon make it useful for a range of applications. Porous silicon may even be light emitting, making it useful in optoelectronics.

In addition to potential applications in silicon-based optoelectronics, porous silicon has been used as an antireflective coating for silicon solar cells. Chemically modified porous silicon may be useful in chemical and biochemical sensing. Porous silicon can serve as an efficient matrix for direct introduction of high mass biomacromolecules in mass spectrometry. In sum, porous silicon is useful in numerous applications and is likely to find many additional uses in the future.

Conventional methods for producing porous silicon are often time-consuming, difficult, or ineffective in producing stable porous silicon structures. Equipment such as a potentiostats and illuminating light sources are required in etching processes of conventional porous silicon production methods. Porous silicon is normally produced by anodic etching, with (n-type) or without (p-type) illumination. In the anodic etch process mobile holes are electrically driven to the silicon-electrolyte interface where they participate in the oxidative dissolution of surface silicon atoms. Spatial anisotropy results from the potential barrier developed at the sharp tips of the evolving structures, which block further hole transport thus preventing further etching and giving rise to the porous structure. Porous silicon has also been made without external bias by chemical etching in $HNO_3$/HF solutions (stain etching), and by photochemical etching.

Stain etching is typically slow (characterized by an induction period), inconsistent in result, unreliable in producing light-emitting porous silicon and is not readily amenable to lateral patterning. Stain etching is mainly used for making very thin porous silicon layers. Recently, it was shown that evaporating and annealing 150–200 nm of aluminum (Al) on Si results in more rapid stain etching. However, the porous silicon produced by this aluminum enhanced stain etching was approximately ten times weaker in luminescence than anodically etched porous silicon of a similar thickness, and the process still exhibits an induction period prior to commencement of etching. See, D. Dimova Malinovska et al., "Thin Solid Films", 297, 9–12 (1997). It has also been reported that Pt could be deposited electrochemically from a Pt (IV) solution onto Si during etching to produce light-emitting porous silicon, although it proved difficult to control the applied potential to affect both silicon etching and Pt deposition simultaneously. See, P. Gorostiza, R. Diaz, M. A. Kulandainathan, F. Sanz, and J. R. Morante, J. Electroanal. Chem. 469, 48 (1999).

Thus, there is a need for an improved method for forming porous silicon. It is an object of the invention to meet that need.

SUMMARY OF THE INVENTION

The present method produces porous silicon (PSi) with tunable morphologies and light emitting properties. In the method of the invention a thin discontinuous metal layer is deposited on a silicon surface. Preferred metals are Pt for strongly light-emitting PSi, Au for PSi with smooth morphology. It is important that the deposited layer be sufficiently thin that it forms a discontinuous film, thereby providing access of etchant species to the silicon surface in the area of the deposited metal. The surface is then etched in a solution including HF and an oxidant for a brief period, as little as 2 seconds to as much as 60 minutes. A preferred oxidant is $H_2O_2$. Morphology and light emitting properties of porous silicon can be selectively controlled as a function of the type of metal deposited, Si doping type, silicon doping level, and etch time. Electrical assistance is unnecessary during the chemical etching of the invention.

BRIEF DESCRIPTION OF THE DRAWINGS

FIG. 1 includes SEM images of Au-coated Si (100) after etching in HF/$H_2O_2$ for 30 s in accordance with the invention. In each image, the top surface is tilted 30° from normal to reveal both top surface and the cross-section.

FIG. 2 includes SEM images of Pt-coated Si (100) after etching in HF/$H_2O_2$ for 30 s in accordance with the method of the invention. In each image, the top surface is tilted 30° from normal.

FIG. 3 includes top view SEM images of Pt-coated Si (100) after etching in HF/ $H_2O_2$ for 30 s in accordance with the present invention.

DETAILED DESCRIPTION OF THE INVENTION

In the method of the invention, a thin discontinuous layer of metal is deposited on a Si surface. The surface is then immersed; for a short time in an oxidizing HF solution to produce porous silicon (PSi). The etching reaction may be carried out in the presence or absence of external illumination, and is conducted in the absence of external electrical bias. Through the invention, PSi with different morphologies and luminescence properties can be rapidly produced by varying: (a) the type of metal deposited, (b) the silicon dopant type, (c) the silicon dopant level, (d) the time of etching, and (e) the amount of metal deposited. Because much of the metal remains, even after prolonged etching, the invention may be used to produce PSi with built-in metal contacts, by choosing a metal of interest for forming ohmic contact to the resulting porous silicon.

Samples of PSi have been produced by the invention in laboratory-scaled experiments. Artisans will recognize the general applicability and scaliability of the invention as a routine extension of the experiments conducted to demonstrate the invention. In the experiments, silicon (100) wafers with different doping levels were used, including: p+ (0.01–0.03 $\Omega$cm), p– (1–10 $\Omega$cm), n+ (0.005–0.02 $\Omega$cm) and n– (10–20 $\Omega$ cm) Si. 30–80 Å of metal (Au, Pt, or Au/Pd) was sputtered onto Si(100), producing metal structures with ~10 nm characteristic lateral dimensions as revealed by atomic force microscopy (AFM). Removing native oxide from the silicon wafers before sputter coating is not necessary. Aqueous $H_2O_2$ was added to aqueous HF/EtOH solution in a Teflon beaker to produce a solution of 1:1:1 EtOH:HF(49%): $H_2O_2$ (30%) immediately prior to immersing the metal-coated wafers. Etching time can be varied from 2 seconds to 60 min. A mask with rows of 3 mm diameter holes spaced by 6 mm was used to pattern the metal deposition for comparison of etching and luminescence properties in the presence and absence of deposited metal. The development of the pattern deposited using this mask was observed visually upon immersion in the etching solution, with a color change in the metal-coated region from gray to brown then to yellow, depending on the elapsed etching time. Gas evolution from the metal coated area was clearly observed, especially for Pt and Au/Pd. In no case was any metal dissolution observed, in contrast to the behavior if thick continuous layers of evaporated Al are deposited prior to etching. A high-resolution field emission SEM (Hitachi S4700) was used to characterize the surface morphology, both in-plane and in cross-section. A SPEX fluorimeter equipped with a 500 W Xe lamp excitation source, two monochromators and a Hamamatsu RT220P PMT, was used to examine the photoluminescence (PL) spectral behavior. Luminescence images were acquired on an inverted microscope (Zeiss Axiovert 100) equipped with a 150 W Hg lamp and a color camera (Sony Medical Instruments, Model DCX 9000).

Figure 1A:
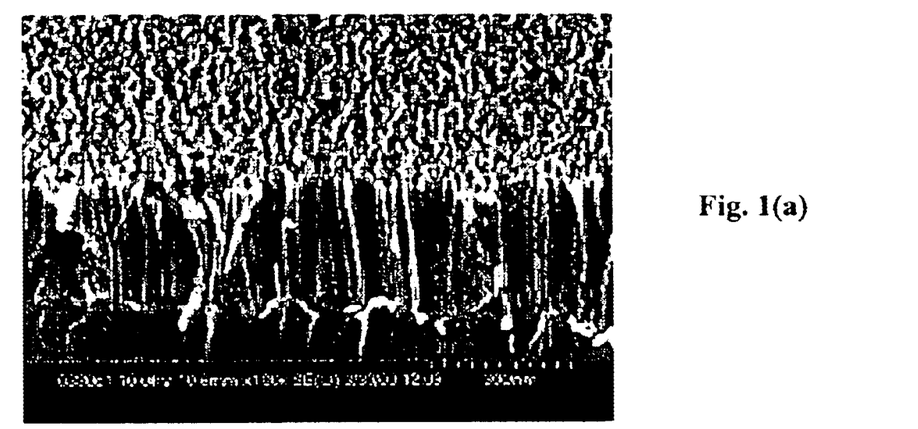
FIG. 1(a) is an image of an Au-coated area on p+ Si.
Figure 1B:
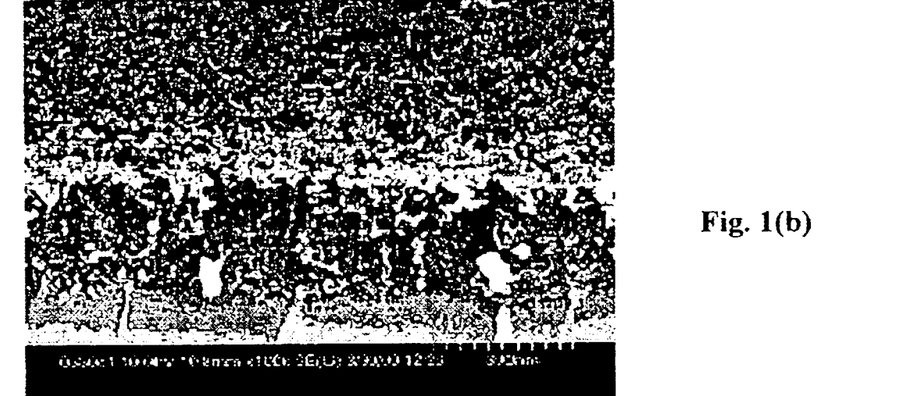
FIG. 1(b) is an image taken off the Au-coated area on p+ Si.
Figure 1C:
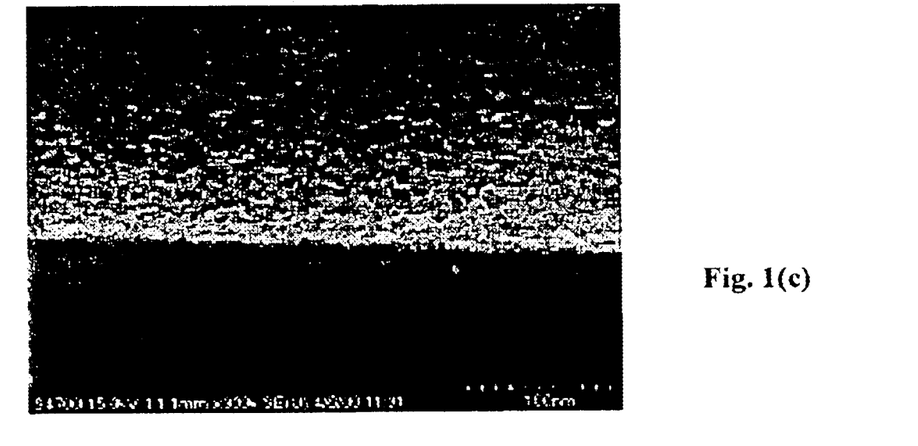
FIG. 1(c) is an image taken off the Au-coated area on p– Si. The scale bars in FIGS. 1(a), 1(b) and 1(c) respectively represent 300 nm, 300 nm and 100 nm.

FIGS. 1(a) and 1(b) show SEM images of an Au-coated p+ Si wafer subjected to HF-oxidant etching for 30 seconds. In FIG. 1(a), large (30 nm) interconnected pores propagating anisotropically perpendicular to the surface, similar to the morphology observed on anodically etched PSi from heavily doped Si, are observed on the Au-coated areas. In contrast, in the areas shown in FIG. 1 between the Au on the same wafer, a much more compact structure with random arrays of small pores (~3 nm spaced by about 3 nm) can be seen, similar to anodically etched porous silicon from moderately doped (p–) silicon wafers. The etching depth is about 350 nm and on the Au-coated areas and 250 nm off the Aucoated areas. For n+ and p– silicon etched under identical conditions, the morphology in the Au-coated areas exhibits columnar structure similar to the p+ sample seen in FIG. 1(a), with small variations in pore size and etching depth. Off the Au-coated areas on both n+ and p– silicon the morphology resembles that of p+ samples. A significantly smaller etch depth of 10 nm was obtained for an Au-coated p– wafer, as seen in FIG. 1(c).

Figure 2A:
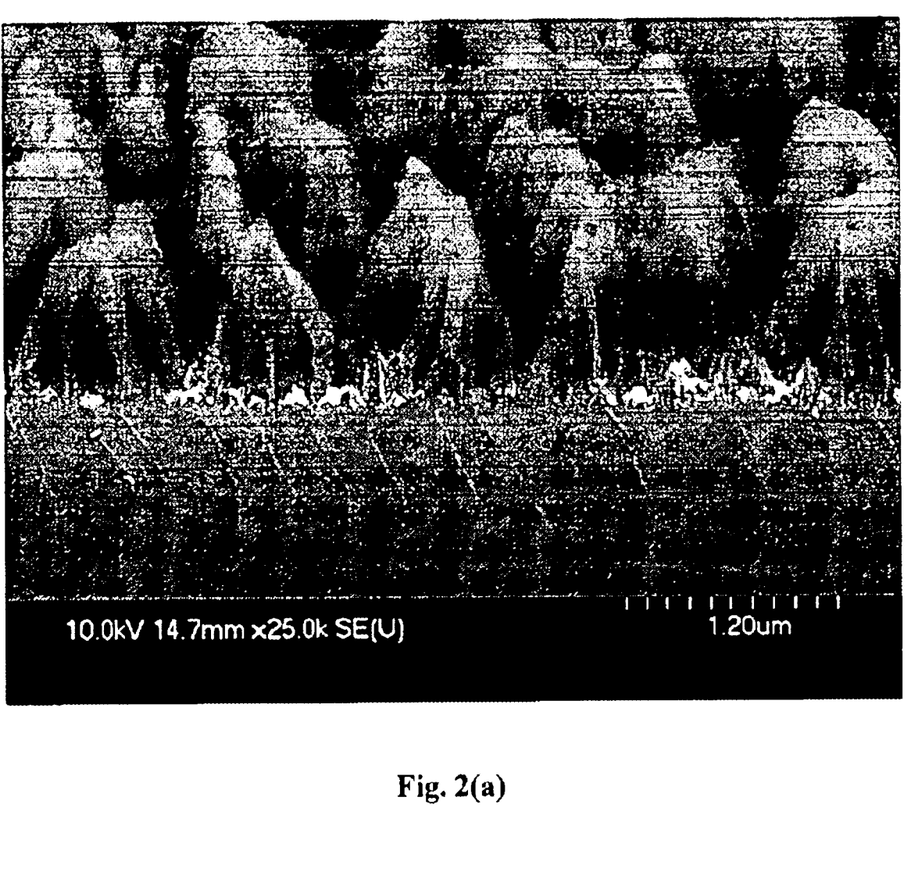
FIG. 2(a) is an image of a Pt-coated area on p+ Si.
Figure 2B:
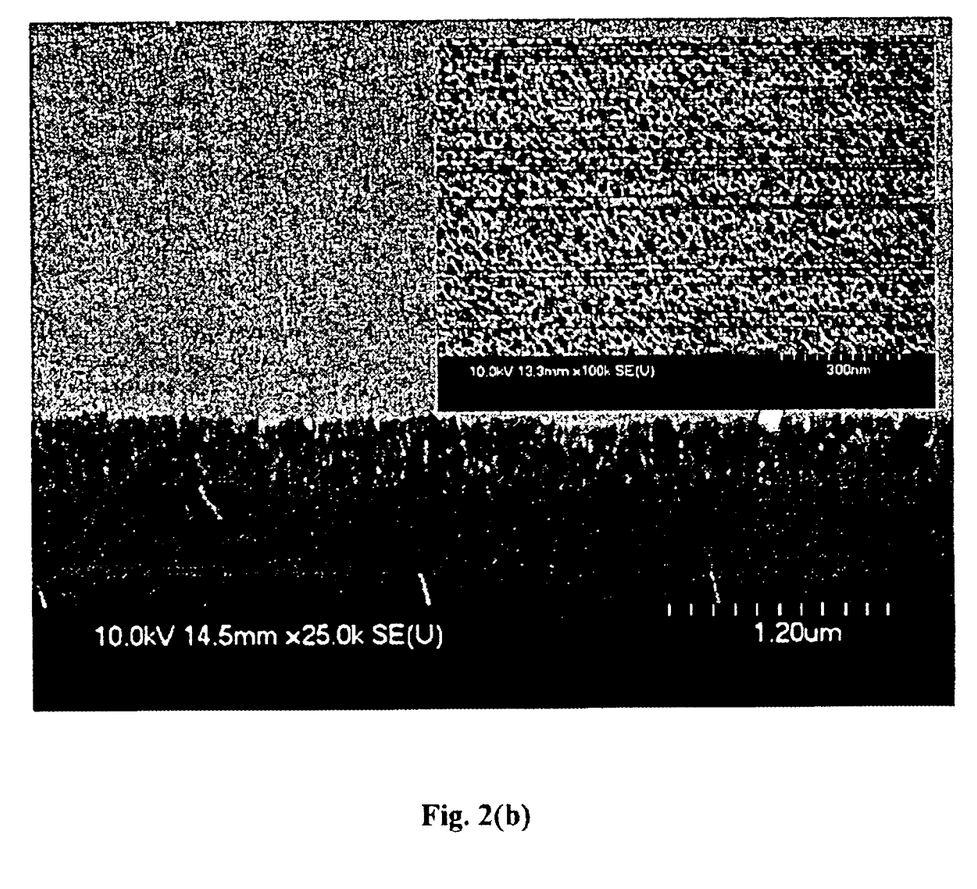
FIG. 2(b) is an image taken off the Pt-coated area on p+ Si with an inset showing a high magnification view of the top surface. The scale bars represent 1.2 $\mu$m in FIGS. 2(a) and 2(b), respectively, while that of the inset represents 300 nm.

The invention was also demonstrated with other metals. FIG. 2 shows SEM images on and off Pt-coated areas of a p+-silicon subjected to HF-oxidant etching for 30 seconds. The Pt-coated sample results in a rougher and deeper structure than the Au-coated sample. In the Pt-coated area shown in FIG. 2(a), columnar structures are clustered together at the tip, and the etch depth exceeds 1 $\mu$m. The area without Pt shown in FIG. 2(b) is flat with small (~5–20 nm) interconnected pores, and the etch depth is 320 nm—small compared to the Pt-coated area but deeper than comparable areas on the Au-coated sample. For p– wafers, the etch depths on and off Pt-coated areas are about 300 nm and 35 nm, respectively. The p– wafers display smoother top morphology on the Pt-coated areas, while the off-Pt areas are rougher in depth than those for p+ wafers.

Figure 3A:
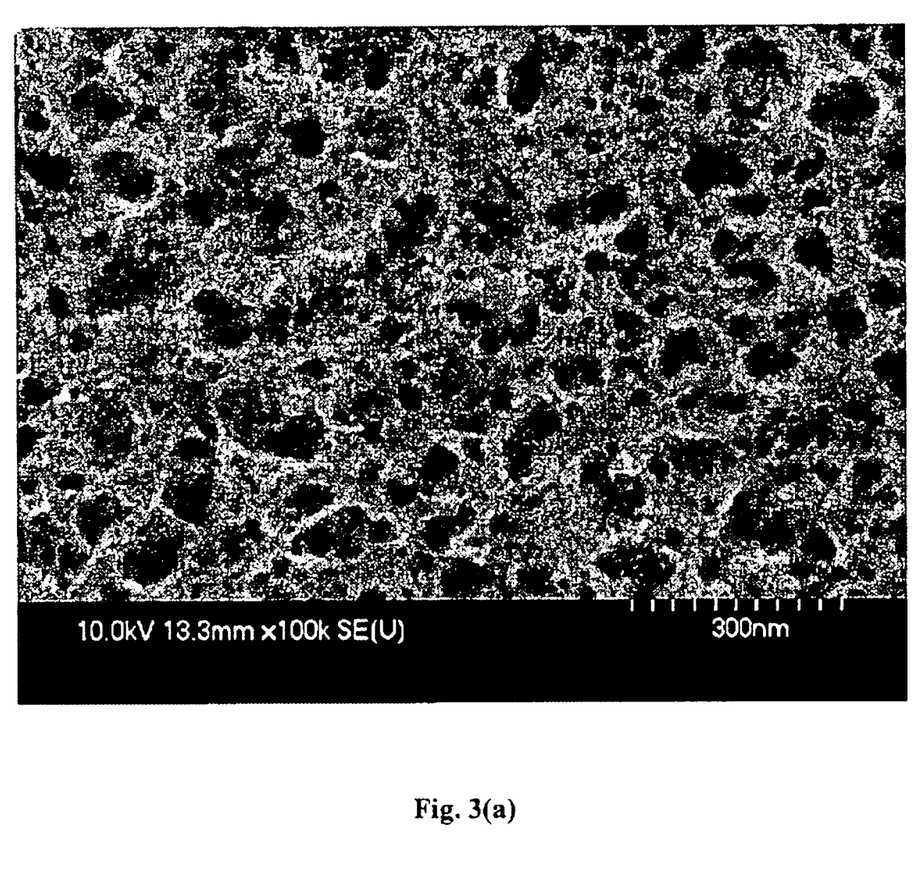
FIG. 3(a) is an image of a Pt-coated area of p– Si.
Figure 3B:
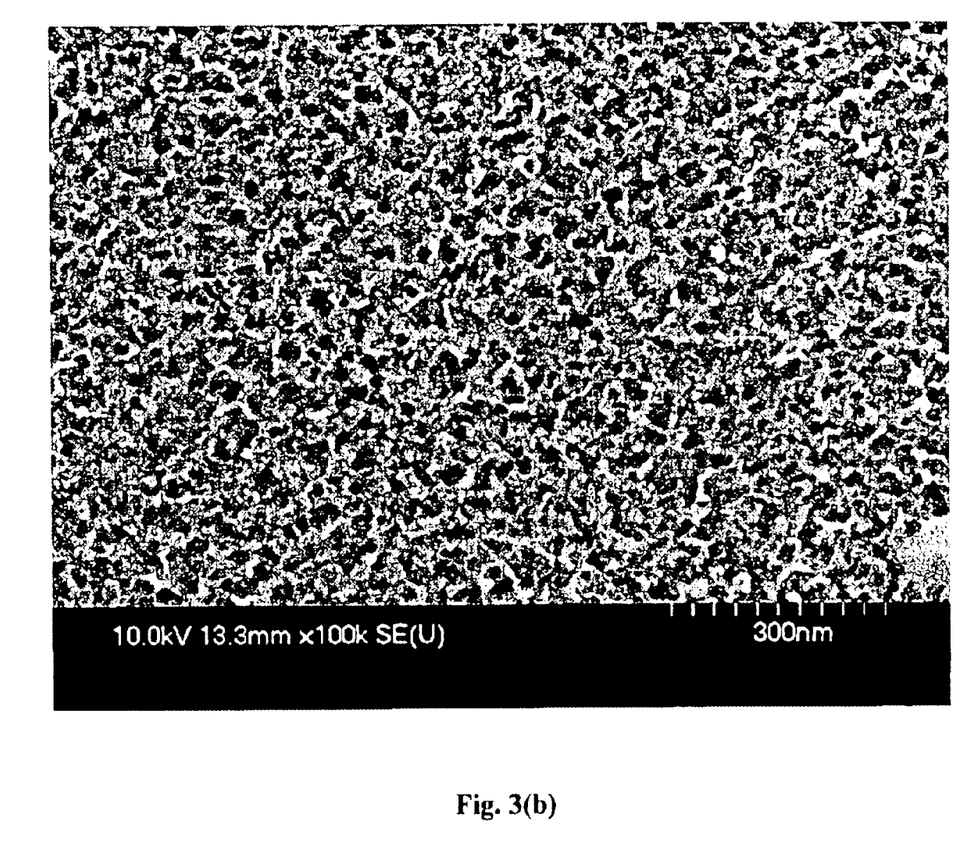
FIG. 3(b) is an image taken off the Pt coated area of p– Si.

HF-oxidant etching of Si coated with Au/Pd in a one-to-one ratio was also studied. The morphology and luminescence properties of the PSi produced were similar to Pt-coated Si, as shown by FIG. 3. For all doping concentrations examined (p+, p– and n+), metal-coated areas always exhibit larger pores with columnar structure, while the off-metal areas always display smaller pores (3–5 nm) and randomly oriented structures. In each case, the exact pore sizes and connectivity vary with doping levels and etching time, producing large differences in luminescence properties.

Figure 4:
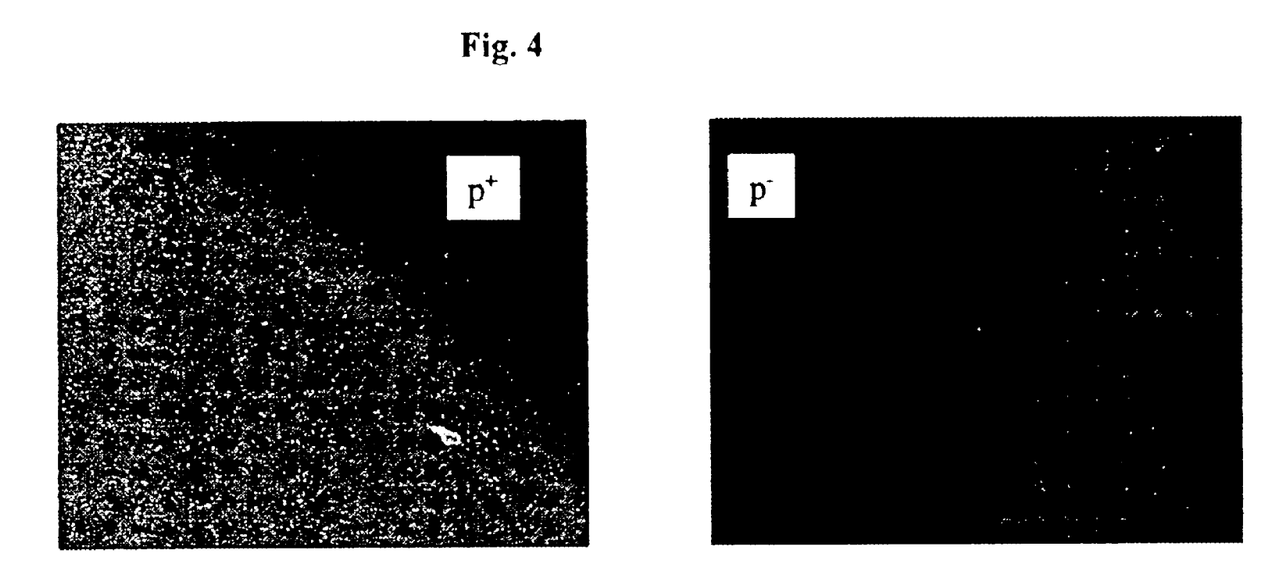
FIG. 4 includes luminescence images of p+ and p– Si with patterned Pt-dots after a 30 s etching in accordance with the invention. The images were produced in response to excitation at 364 nm and consist of wavelength-integrated luminescence at wavelengths longer than 400 nm. Due to the limited field of view only part of the Pt coated dot is shown in the images—the concave side of the arc corresponding to the Pt-coated area.
Figure 5:
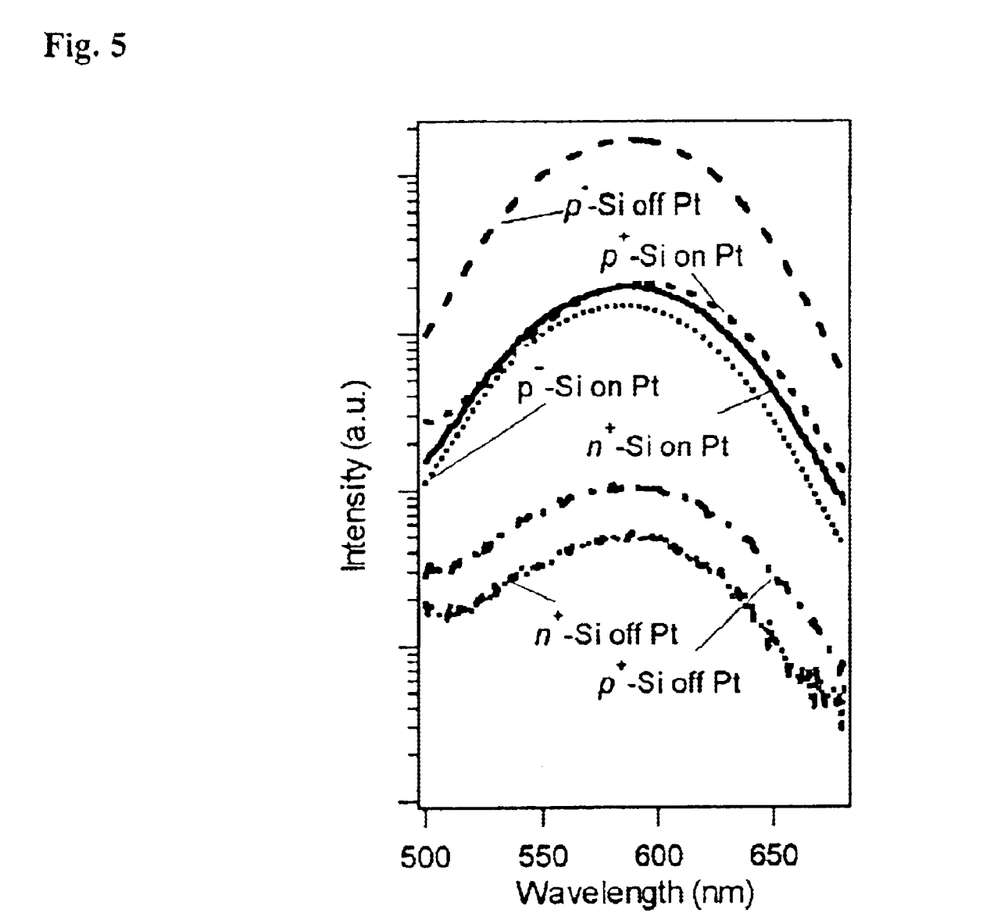
FIG. 5 charts photoluminescence spectra taken from Pt-patterned Si after a 30 s etching in accordance with the invention.
Figure 6:
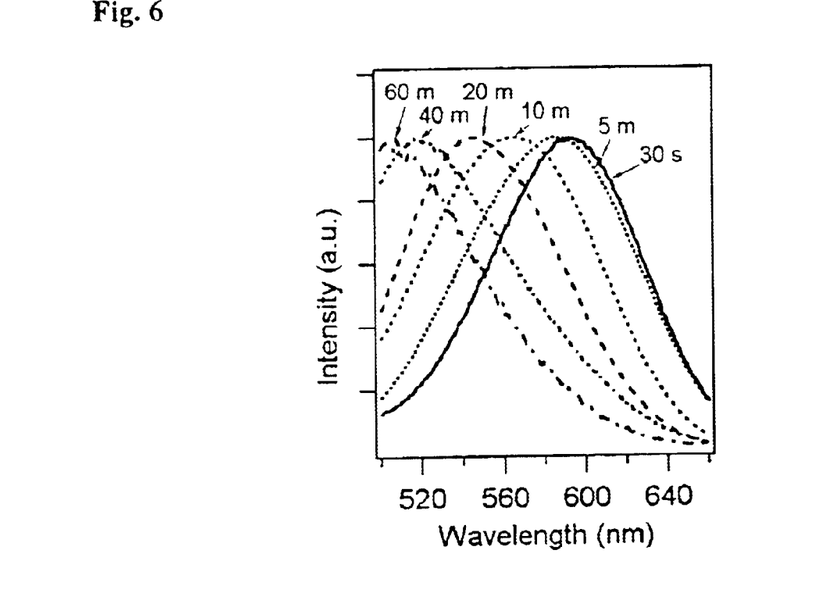
FIG. 6 charts the emission spectra of porous silicon samples prepared from p– silicon by the method of the invention for various etch times, showing a blue shift of the wavelength of maximum emission with increased etch time.

Comparing relative etch rates reveals that Pt-assisted HF-oxidant etching proceeds much faster than Au-assisted etching. More importantly, PSi produced with Pt shows more intense photoluminescence (PL) than those produced by Au-assisted HF-oxidant etching. Furthermore, depending on the doping type, doping level, and etching time, luminescence patterns can be formed which are correlated with the metal deposition pattern FIG. 4 compares luminescence images of HF-oxidant etched p+ and p– Si patterned with circular Pt areas. Stronger PL can be seen from the Pt-coated area for p+ wafer, while the uncoated area provides stronger PL in the p– sample. Stronger PL is also obtained from the Pt-coated areas on n+ Si (not shown). PL spectra taken from different areas on differently doped samples are shown in FIG. 5. The thin layer (35 nm) in the off Pt areas of p– Si produced the strongest PL intensity among all samples, and was more intense than 10 times the thickness of PSi produced by anodic etching. In addition, the PL peaks are centered at 590 nm, which is blue shifted ~100 nm from PSi formed by anodic etching. Furthermore, with etch times longer than 5 min the resulting material displays a blue-shifted emission spectrum, with the wavelength of maximum emission scaling with etch time from 650 nm at 5 min (or shorter) to less than 500 nm at 60 min for p⁻ Si, as shown in FIG. 6.

AFM imaging indicates that these thin metal coatings on Si appear as nanometer size (~10 nm) islands prior to etching, with thermal annealing producing larger islands. However, the PSi pore sizes produced have no direct correspondence with the size or spacing of the deposited metal islands, i.e., the metal-coating does not act as an etch-mask. Etching according to the invention works not only for p-type Si but also for n-Si, even in the dark. Control experiments, in which wafers without metal-coatings were immersed for the same period of time in $H_2O_2$/HF/EtOH, produced no morphological features observable by SEM and no detectable PL. The results clearly indicate that a thin discontinuous layer of metal is required for Si etching, with Pt producing the fastest etching rate and most intensely luminescent PSi.

In fact, these metals are required to obtain chemical etching under the conditions employed here. Prolonged (up to 60 min) etching of Au-coated Si can produce PSi that is rough and deep but never as strong in PL as those produced with Pt.

Strongly luminescent PSi can also be produced adjacent to, but macroscopic distances away from, the metal-coated areas, in contrast to control experiments in which the absence of a metal coating correlates with the lack of detectable etching. This suggests that lateral transport of charge carriers and chemical species occurs during etching. Etching by the invention may occur as a localized electrochemical process, with the nanometer-sized metal acting as a local cathode. By this model, microscopically local anode (Si) and cathode (metal) sites form on the etched surface with local cell currents flowing between the sites during etching. The reaction at the cathode generates holes, while the reaction at the anode consumes them in the dissolution of Si. In analogy with the pioneering studies of Si etching, the following mechanism is proposed, Cathode reaction (at metal):

$$H_2O_2 + 2H+ \rightarrow 2H_2O + 2h + 2H+ + 2e- \rightarrow H_2\uparrow$$

Anode reaction:

$$Si + 4h+ + 4HF \rightarrow SiF_4 + 4H + SiF_4 + 2HF \rightarrow H_2SiF_6$$

Overall reaction:

$$Si + H_2O_2 + 6HF \rightarrow 2H_2O + H_2SiF_6 + H_2\uparrow$$

A critical feature of this reaction scheme is the generation of h+ from $H_2O_2$ and the reduction of $H^+$ to form $H_2$, both of which are facilitated by the metal particles. Since h+ derives from $H_2O_2$, this mechanism indicates that PSi can be generated in the same way regardless of doping type and level, as was observed experimentally. However, the difference in doping level is reflected in the etch depth away from metal-coated areas. In the uncoated areas, higher doping correlates with faster etching and deeper etch depths at fixed times. Since the higher conductivity of the n+ and p+ samples relative to p– samples would facilitate carrier transport, this observation is also consistent with the above mechanism. The observation of much higher etch rates for Pt and Pd than Au suggest a catalytic role, but we do not have direct evidence of catalysis at this time. Finally, the proposed $H_2O_2$ is but one possible oxidant, and others may work as well or better—the key feature being the ability to generate mobile holes at the metal-solution interface.

Figure 7:
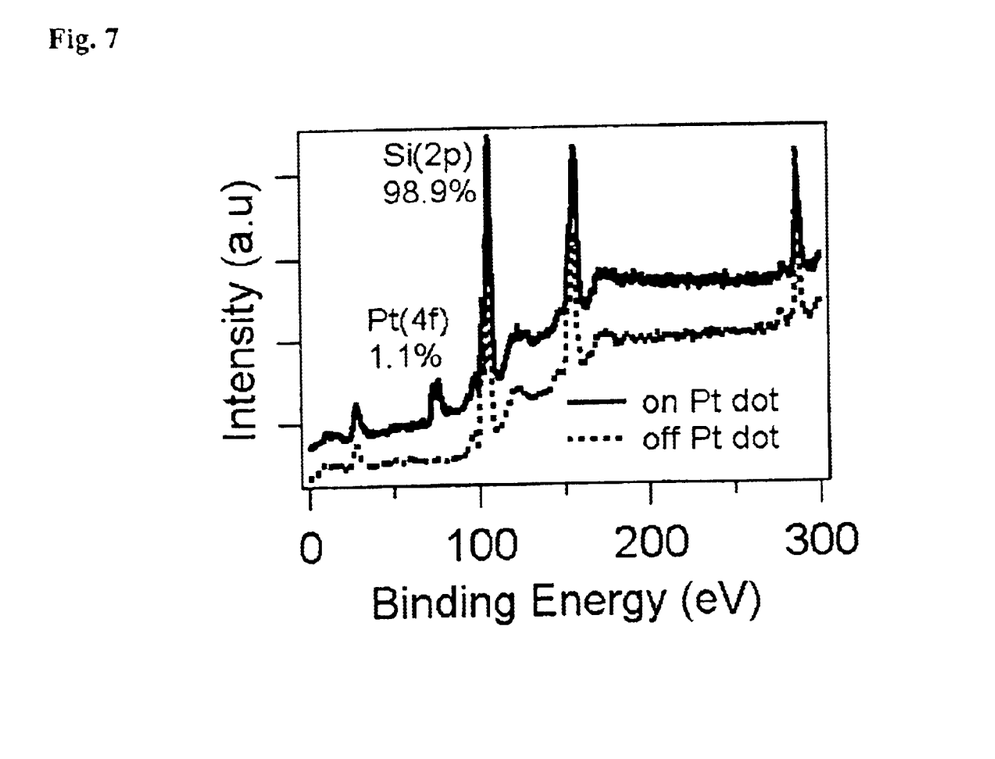
FIG. 7 charts the x-ray photoelectron spectra of a silicon sample processed by the method of the invention in the region where Pt was deposited and in a region away from the Pt deposition, showing that significant Pt remains after processing.

Rutherford back scattering analysis and X-ray photoelectron spectroscopy (FIG. 7) show that some metal remains on the metal coated areas of the silicon surface after etching by the invention and rigorous rinsing, showing that etching of the invention should provide in situ metal contacts for PSi. Making contacts to PSi is important for devices with PSi top layers, because the fragile and unstable nature of the porous layer makes it difficult to accomplish without altering the properties of the PSi.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for producing porous silicon, the method comprising steps of:

depositing a thin discontinuous layer of metal on a Si surface;

forming the porous silicon by etching the Si surface having said discontinuous layer in a HF and oxidant solution, said etching being conducted without external electrical bias.

2. The method according to claim 1, wherein said step of etching is conducted in the absence of illumination.

3. The method according to claim 1, wherein said step of etching is conducted in the presence of illumination.

4. The method according to claim 1, wherein said metal comprises Pt.

5. The method according to claim 1, wherein said metal comprises Au.

6. The method according to claim 1, wherein said metal comprises Pd.

7. The method according to claim 1, wherein said metal comprises a combination of metals selected from the group consisting of Au, Pt and Pd.

8. The method according to claim 1, wherein said oxidant comprises $H_2O_2$.

9. The method according to claim 1, wherein the thickness of said metal is less than approximately 10 nm.

10. The method according to claim 1, wherein said etching is conducted for a time period between about 2 seconds and one hour.

11. A method for producing porous silicon, the method consisting of the following steps:

depositing a thin discontinuous layer of metal on a Si surface;

forming the porous silicon by etching the Si surface in a HF and oxidant solution for a period of about two seconds up to 60 minutes, said etching being conducted without external electrical bias.

12. The method according to claim 11, wherein said step of etching is conducted in the presence of illumination.

13. The method according to claim 11, wherein said metal comprises Pt.

14. The method according to claim 11, wherein said metal comprises Au.

15. The method according to claim 11, wherein said metal comprises Pd.

16. The method according to claim 11, wherein said metal comprises a combination of metals selected from the group consisting of Au, Pt and Pd.

17. The method according to claim 11, wherein said step of etching is conducted in the absence of illumination.

18. The method according to claim 17, wherein said metal comprises a combination of metals selected from the group of Au, Pt and Pd.

19. The method according to claim 17, wherein said oxidant comprises $H_2O_2$.

20. The method according to claim 17, wherein the thickness of said metal is than approximately 10 nm.

21. A method for producing porous silicon, the method comprising steps of:

depositing metal on a Si surface in a thickness sufficient to permit nucleation that forms nanometer size metal particles and small enough to prevent formation of a continuous metal layer;

forming the porous silicon by etching the Si surface having said discontinuous layer in a HF and oxidant solution for a period of about two seconds up to 60 minutes, said ethcing being conducted without external electrical bias.

* * * * *

UNITED STATES PATENT AND TRADEMARK OFFICE
CERTIFICATE OF CORRECTION

PATENT NO. : 6,790,785 B1
DATED : September 14, 2004
INVENTOR(S) : Liu et al.

It is certified that error appears in the above-identified patent and that said Letters Patent is hereby corrected as shown below:

Column 3,
Line 64, delete "Aucoated" and insert -- Au-coated -- therefor

Column 5,
Line 21, delete "$H_2O_2 + 2H + \rightarrow 2 H_2O + 2h + 2H + 2e - \rightarrow H_2\uparrow$" and insert -- $H_2O_2 + 2 H+ \rightarrow 2 H_2O + 2 h+ 2H + +2 e- \rightarrow H_2\uparrow$ -- therefor
Line 25, delete "$Si + 4h + + 4HF \rightarrow SiF_4 + 4H + SiF_4 + 2HF \rightarrow H_2SiF_6{}^{11}$" and insert -- $Si + 4 h+ + 4 HF \rightarrow SiF_4 + 4 H+ SiF_4 + 2 HF \rightarrow H_2SiF_6$ -- therefor Signed and Sealed this Twelfth Day of July, 2005

JON W. DUDAS
*Director of the United States Patent and Trademark Office*